(12) United States Patent
You et al.

(10) Patent No.: US 10,928,456 B2
(45) Date of Patent: Feb. 23, 2021

(54) METHOD AND APPARATUS FOR ESTIMATING STATE OF BATTERY

(71) Applicant: SAMSUNG ELECTRONICS CO., LTD., Suwon-si (KR)

(72) Inventors: Kaeweon You, Hwaseong-si (KR); SangDo Park, Seoul (KR); Young Hun Sung, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 298 days.

(21) Appl. No.: 15/864,405

(22) Filed: Jan. 8, 2018

(65) Prior Publication Data

US 2019/0056452 A1 Feb. 21, 2019

(30) Foreign Application Priority Data

Aug. 17, 2017 (KR) .................. 10-2017-0104046

(51) Int. Cl.
*B60L 58/10* (2019.01)
*B60L 58/16* (2019.01)
*G01R 31/36* (2020.01)
*G06N 3/04* (2006.01)
*G01R 31/367* (2019.01)

(52) U.S. Cl.
CPC .......... *G01R 31/3648* (2013.01); *B60L 58/10* (2019.02); *B60L 58/16* (2019.02); *G01R 31/367* (2019.01); *G06N 3/0445* (2013.01); *G06N 3/0454* (2013.01); *B60L 2240/545* (2013.01); *B60L 2240/547* (2013.01); *B60L 2240/549* (2013.01)

(58) Field of Classification Search
CPC .............. B60L 58/16; B60L 2240/549; B60L 2240/545; B60L 2240/547; B60L 58/10; G01R 31/367; G01R 31/3648
See application file for complete search history.

(56) References Cited

U.S. PATENT DOCUMENTS 7,295,014 B2 * 11/2007 Koch ................. G01R 31/3842
324/432
8,258,751 B2 9/2012 Esnard
9,483,728 B2 11/2016 Dognin et al.
(Continued)

FOREIGN PATENT DOCUMENTS

CN 106250103 A 12/2016
EP 2 975 421 A1 1/2016
(Continued)

OTHER PUBLICATIONS

You, Gae-won, et al., "Data-driven SOH Prediction for EV Batteries", *2015 IEEE International Conference on Consumer Electronics (ICCE)*, 2015 (pp. 577-578).
(Continued)

*Primary Examiner* — Mohamed Charioui
(74) *Attorney, Agent, or Firm* — NSIP Law

(57) ABSTRACT

Disclosed is a battery state estimation method and apparatus, the method includes extracting data from target intervals in sensing data of a battery, generating feature vectors of the data extracted from each of the target intervals, applying a weight to each of the generated feature vectors, merging the feature vectors to which the weight is applied, and determining state information of the battery based on the merging.

25 Claims, 11 Drawing Sheets

(56) References Cited

U.S. PATENT DOCUMENTS

| | | | | |
|---|---|---|---|---|
| 10,114,079 | B2* | 10/2018 | Duan | G01R 31/3648 |
| 2013/0069660 | A1 | 3/2013 | Bernard et al. | |
| 2014/0180614 | A1* | 6/2014 | Chaturvedi | G01R 31/3648 |
| | | | | 702/63 |
| 2015/0301122 | A1* | 10/2015 | Lee | G01R 31/392 |
| | | | | 702/63 |
| 2016/0033582 | A1* | 2/2016 | You | G06K 9/00536 |
| | | | | 324/427 |
| 2016/0195587 | A1* | 7/2016 | Lee | G01R 31/392 |
| | | | | 702/63 |
| 2016/0231386 | A1* | 8/2016 | Sung | G01R 31/382 |
| 2016/0239759 | A1 | 8/2016 | Sung | |

FOREIGN PATENT DOCUMENTS

| | | |
|---|---|---|
| EP | 2 980 596 A1 | 2/2016 |
| JP | 4587299 B2 | 11/2010 |
| JP | 5552449 B2 | 7/2014 |
| KR | 10-2016-0000317 A | 1/2016 |
| KR | 10-2016-0101506 A | 8/2016 |

OTHER PUBLICATIONS

Zhou, Peng, et al. "Attention-Based Bidirectional Long Short-Term Memory Networks for Relation Classification." *Proceedings of the 54th Annual Meeting of the Association for Computational Linguistics (vol. 2: Short Papers)*, Berlin, Germnay, Aug. 2016 (pp. 207-212).

Wang, Yequan et al., "Attention-based LSTM for Aspect-level Sentiment Classification", *Proceedings of the 2016 Conference on Empirical Methods in Natural Language Processing*, Nov. 2016, (pp. 606-615).

Keren, Gil et al., "Convolutional RNN: an Enhanced Model for Extracting Features from Sequential Data", *2016 International Joint Conference on Neural Networks (IJCNN)*, Feb. 18, 2016 (pp. 3412-3419).

Gensler, Andre et al., "Deep Learning for solar power forecasting—An Approach using AutoEncoder and LSTM Neural Networks", *2016 IEEE International Conference on Systems, Man, and Cybernetics (SMC)*, Budapest, Hungary, Oct. 9-12, 2016 (pp. 002858-002865).

Extended European Search Report dated Dec. 5, 2018 for the corresponding European Patent Application No. 18170329.9 (14 pages in English).

You, Gae-Won, et al. "Diagnosis of Electric Vehicle Batteries Using Recurrent Neural Networks." *IEEE Transactions on Industrial Electronics* 64.6 (2017): 4885-4893. (9 pages, in English).

* cited by examiner

100

METHOD AND APPARATUS FOR ESTIMATING STATE OF BATTERY

CROSS-REFERENCE TO RELATED APPLICATIONS

This application claims the benefit under 35 USC § 119(a) of Korean Patent Application No. 10-2017-0104046 filed on Aug. 17, 2017 in the Korean Intellectual Property Office, the entire disclosure of which is incorporated herein by reference for all purposes.

BACKGROUND

1. Field

The following description relates to battery state estimation.

2. Description of Related Art

With the increasing importance on environmental issues and the focus on the dwindling energy resource, electric vehicles is emerging as a favorable choice for transportation. The electric vehicle uses a battery, where rechargeable secondary cells are formed to be a single pack as a main power source. Thus, the electric vehicle does not emit exhaust gas and produces little noise.

In the electric vehicle, the battery functions as an engine and a fuel tank of a gasoline car. For safety of a user of the electric vehicle, it is important to check a state of the battery.

Recently, extensive research has been conducted to increase accuracy on detecting an abnormality of the battery.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a method of estimating a state of a battery, the method including extracting data from target intervals in sensing data of a battery, generating feature vectors of the data extracted from each of the target intervals, applying a weight to each of the generated feature vectors, merging the feature vectors to which the weight is applied, and determining state information of the battery based on the merging.

The generating of the feature vectors may include sampling the extracted data from the each of the target intervals, and encoding the sampled data to generate the feature vectors.

The applying of the weight to the generated feature vectors may include calculating weights based on the generated feature vectors and a previous state information of the battery, and applying the calculated weights to the generated feature vectors.

The method may include setting an additional target interval in the sensing data and extracting data from the additional target interval, in response to an occurrence of an update event of the state information, encoding the data extracted from the additional target interval and generating an additional feature vector, and updating the state information based on applying a second weight to the generated additional feature vector and applying a third weight to a portion of the generated feature vectors.

The method may include randomly setting each of the target intervals in the sensing data.

The lengths of the target intervals may be different from one another.

The update event may correspond to any one of a user input or a time exceeding an update time period.

A greatest weight may be applied to a feature vector associated with a target interval having a most stable pattern change from among the target intervals.

In another general aspect, there is provided an apparatus for estimating a state of a battery, the apparatus including a controller configured to extract data from target intervals in sensing data of a battery, to generate feature vectors of the data extracted from each of the target intervals, to apply a weight to each of the generated feature vectors, to merge the feature vectors to which the weight is applied, and to determine state information of the battery based on the merged feature vectors.

The controller may be configured to sample the extracted data from the each of the target intervals, to encode the sampled data, and to generate the feature vectors.

The controller may be configured to calculate weights based on the generated feature vectors and a previous state information of the battery, and to apply the calculated weights to the generated feature vectors.

In response to an occurrence of an update event of the state information, the controller may be configured to set an additional target interval in the sensing data and extracting data from the additional target interval, to encode the data extracted from the additional target interval, generate an additional feature vector, and to update the state information based on a result obtained by applying a second weight to the generated additional feature vector and a result obtained by applying a third weight to a portion of the generated feature vectors.

The controller may be configured to randomly set each of the target intervals in the sensing data.

The lengths of the target intervals may be different from one another.

A greatest weight may be applied to a feature vector associated with a target interval having a most stable pattern change from among the target intervals.

In another general aspect, there is provided an apparatus for estimating a state of a battery, the apparatus including a controller configured to extract data from target intervals in sensing data of a battery, and to determine state information of the battery based on the extracted data and a state estimation model, wherein the state estimation model comprises a first layer configured to generate feature vectors of the data extracted from each of the target intervals, a second layer configured to apply a weight to each of the generated feature vectors and to merge the feature vectors to which the weight is applied, and a third layer configured to determine the state information of the battery based on the merged feature vectors.

The first layer may be configured to recognize a pattern change of each piece of the extracted data.

The second layer may be configured to calculate weights based on the generated feature vectors and previous state information of the battery and to apply the calculated weights to the generated feature vectors.

The third layer may be configured to determine the state information by performing regression on the merged feature vectors.

In another general aspect, there is provided a vehicle including a battery module, sensors configured to sense data of the battery module, and a battery state estimation apparatus implemented on a processor, the battery state estimation apparatus including an extractor configured to receive the sensed data, to set target intervals in the sensed data, and to extract data from each of the target intervals, an encoder configured to generate feature vectors corresponding to each target interval based on encoding the extracted data from the each target interval, respectively, a vector merger configured to apply weights to each of the generated feature vectors, and to merge the weighted feature vectors, and an estimator configured to determine state information of the battery module based on the merged feature vectors.

Each of the feature vectors may correspond to a change in a pattern of the data extracted from the each target interval, respectively.

A greatest weight is applied to a feature vector from the feature vectors having the least change in the pattern of the extracted data.

The data of the battery module may include any one or any combination of voltage data, current data, and temperature data of the battery module.

The vehicle may include a memory coupled to the processor, the memory including an instruction executed by the processor, and the memory being configured to store the sensed data, the feature vectors, and the determined state information, and an output configured to communicate the determine state information of the battery.

Other features and aspects will be apparent from the following detailed description, the drawings, and the claims.

Figure 1:
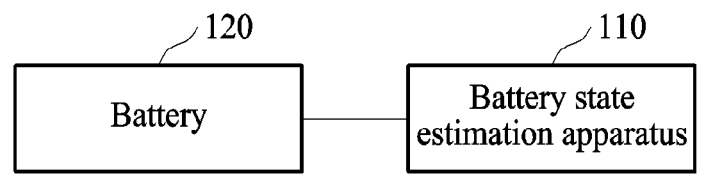
FIG. 1 illustrates an example of a battery apparatus.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Also, in the description of embodiments, detailed description of well-known related structures or functions will be omitted when it is deemed that such description will be redundant.

Regarding the reference numerals assigned to the elements in the drawings, it should be noted that the same elements will be designated by the same reference numerals, wherever possible, even though they are shown in different drawings. Also, in the description of embodiments, detailed description of well-known related structures or functions will be omitted when it is deemed that such description are redundant.

FIG. 1 illustrates an example of a battery apparatus.

Referring to FIG. 1, a battery apparatus 100 includes a battery state estimation apparatus 110 and a battery 120. The battery 120 may be, for example, a battery cell, a battery module, or a battery pack.

The battery state estimation apparatus 110 sets target intervals for sensing data of the battery 120 and determines state information of the battery 120 from data extracted from the target intervals. In an example, the battery state estimation apparatus 110 more accurately determine the state information of the battery 120 by focusing attention on data having the most stable pattern change among the extracted data.

Hereinafter, an operation of the battery state estimation apparatus 110 will be described with reference to FIGS. 2 through 5.

FIGS. 2 through 5 illustrate examples of an operation of a battery state estimation apparatus.

Figure 2:
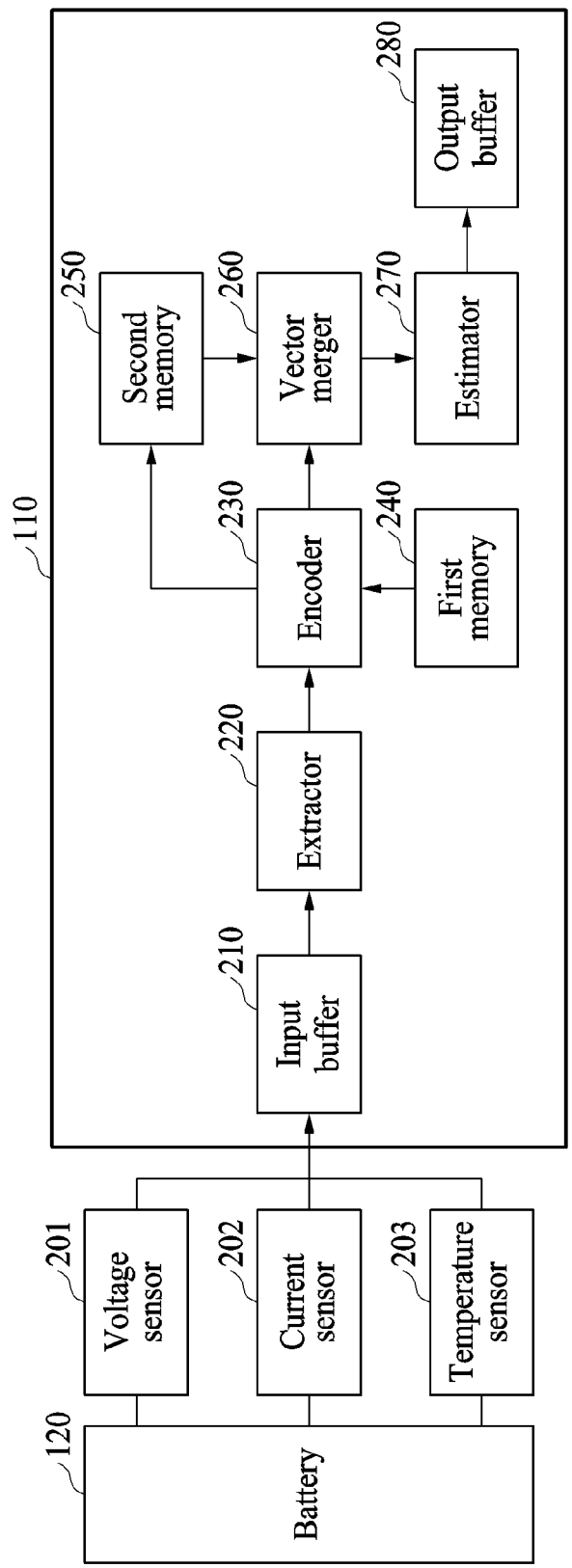
FIGS. 2 through 5 illustrate examples of an operation of a battery state estimation apparatus.

Referring to FIG. 2, the battery state estimation apparatus 110 includes an input buffer 210, an extractor 220, an encoder 230, a first memory 240, a second memory 250, a vector merger 260, an estimator 270, and an output buffer 280.

The extractor 220, the encoder 230, the vector merger 260, and the estimator 270 may be implemented by at least one controller or at least one processor. Additional details on these elements and the processor/controller are provided below. In an example, the input buffer 210 and the output buffer 280 are physically distinguished or logically distinguished in a single buffer. In an example, the first memory 240 and the second memory 250 are physically distinguished or logically distinguished in a single memory.

The input buffer 210 receives sensing data from sensors 201 through 203 and stores the received sensing data. The sensing data includes, for example, any one or any combination of voltage data, current data, and temperature data of the battery 120.

Figure 3:
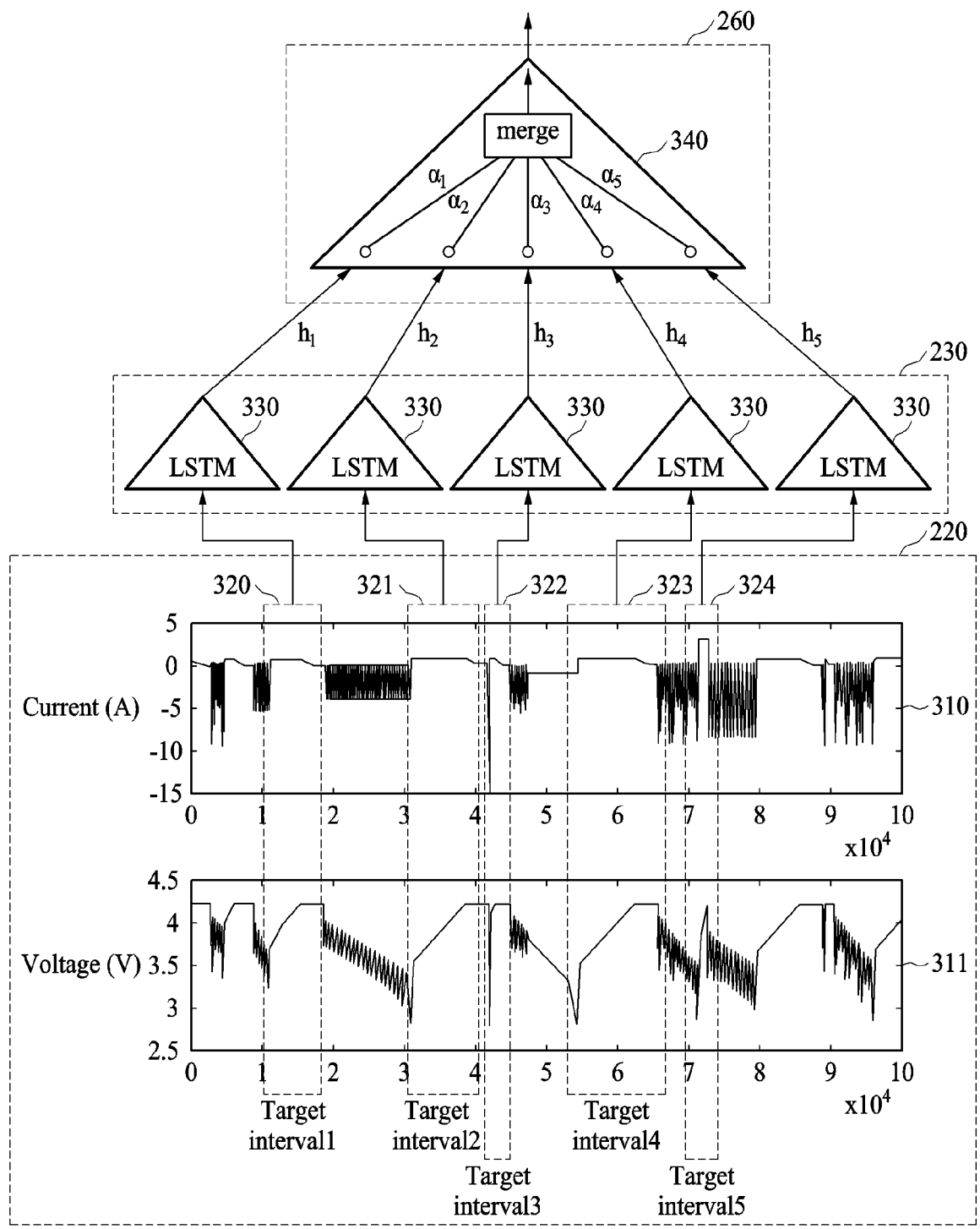

The extractor 220 receives sensing data from the input buffer 210 and sets target intervals in the sensing data. As illustrated in FIG. 3, the extractor 220 sets target intervals 1 through 5, for example, target intervals 320 through 324 in current data 310 and voltage data 311. In this example, each of the target intervals 320 through 324 may have a different length or the same length. The extractor 220 randomly sets the target intervals 320 through 324 in the sensing data.

The extractor 220 extracts data included in each of the target intervals 320 through 324. The extractor 220 extracts interval data corresponding to each of the target intervals 320 through 324. The extractor 220 outputs the extracted data to the encoder 230.

Depending on examples, the extractor 220 samples each pieces of the extracted data and outputs the sampled data to the encoder 230.

The encoder 230 generates feature vectors by encoding the extracted data. In an example, the encoder 230 is trained to perform input pattern change recognition or pattern recognition, and thus, generates feature vectors expressing pattern changes of the extracted data. The encoder 230 is, for example, based on a neural network. Referring to FIG. 3, the encoder 230 is based on a long short term memory (LSTM) 330 and applies at least one parameter stored in the first memory 240 to the LSTM 330. The LSTM 330 of the encoder 230 generates a feature vector $h_1$ by encoding current data and voltage data extracted from the target interval 320. The feature vector $h_1$ expresses a pattern change of each of the current data 310 and the voltage data 311 in the target interval 320. Similarly, the LSTM 330 of the encoder 230 generates feature vectors $h_2$, $h_3$, $h_4$, and $h_5$ by encoding current data and voltage data extracted from each of the target intervals 321 through 324, respectively. The encoder 230 stores the feature vectors $h_1$, $h_2$, $h_3$, $h_4$, and $h_5$ in the second memory 250.

The vector merger 260 applies weights to the feature vectors and merges the feature vectors to which the weights are applied. The vector merger 260 is based on, for example, a neural network. In the example of FIG. 3, the vector merger 260 is based on an attention network 340. The vector merger 260 calculates weights $\alpha_1$, $\alpha_2$, $\alpha_3$, $\alpha_4$, and $\alpha_5$ based on the feature vectors $h_1$, $h_2$, $h_3$, $h_4$, and $h_5$ and previous state information of the battery 120. In an example, the weights $\alpha_1$, $\alpha_2$, $\alpha_3$, $\alpha_4$, and $\alpha_5$ respectively match the feature vectors $h_1$, $h_2$, $h_3$, $h_4$, and $h_5$. A weight matching a feature vector of data having a most stable pattern change among the extracted data is a maximum weight. When noise in the target interval 320 is relatively small in comparison to the target intervals 321 through 324 and the target interval 320 has the most stable pattern change, the weight $\alpha_1$ matching the feature vector $h_1$ associated with the target interval 320, i.e., the feature vector $h_1$ of data extracted from the target interval 320 is the greatest among the weights $\alpha_1$, $\alpha_2$, $\alpha_3$, $\alpha_4$, and $\alpha_5$. The vector merger 260 applies the weights $\alpha_1$, $\alpha_2$, $\alpha_3$, $\alpha_4$, and $\alpha_5$ to the feature vectors $h_1$, $h_2$, $h_3$, $h_4$, and $h_5$, respectively. Since the maximum weight is applied to the feature vector of the data having the most stable pattern change, the battery state estimation apparatus 110 concentrates on the data having the most stable pattern change when determining the state information of the battery 120. The vector merger 260 merges feature vectors $\alpha_1 h_1$, $\alpha_2 h_2$, $\alpha_3 h_3$, $\alpha_4 h_4$, and $\alpha_5 h_5$ to which the weights $\alpha_1$, $\alpha_2$, $\alpha_3$, $\alpha_4$, and $\alpha_5$ are applied. For example, the vector merger 260 obtains a sum of the weights $\alpha_1 h_1$, $\alpha_2 h_2$, $\alpha_3 h_3$, $\alpha_4 h_4$, and $\alpha_5 h_5$. The vector merger 260 outputs a result of the merging to the estimator 270.

The estimator 270 determines the state information of the battery 120 based on the result of the merging. The estimator 270 performs linear regression on the result of the merging, for example, "$\alpha_1 h_1 + \alpha_2 h_2 + \alpha_3 h_3 + \alpha_4 h_4 + \alpha_5 h_5$" and determines a result of the linear regression to be the state information of the battery 120. The estimator 270 is based on, for example, a neural network.

The estimator 270 stores the determined state information in the output buffer 280. In an example, the estimator 270 removes the previous value of feature vector $h_1$ of the data extracted from the target interval 320 among the target intervals 320 through 324 from the second memory 250. Since the feature vector h1 is a feature vector for the oldest data at the time of updating the state information of the battery 120, it may not be most suitable data for updating the state information. In an example, the estimator 270 removes the feature vector $h_1$ from the second memory 250. Accordingly, the feature vectors $h_2$, $h_3$, $h_4$, and $h_5$ are stored in the second memory 250.

In an example, when updating the state information, the battery state estimation apparatus 110 again uses the feature vectors $h_2$, $h_3$, $h_4$, and $h_5$ stored in the second memory 250. Thus, the battery state estimation apparatus 110 may update the state information with a reduced amount of operations and an improved speed. Related description will be provided with reference to FIGS. 4 and 5.

Figure 4:
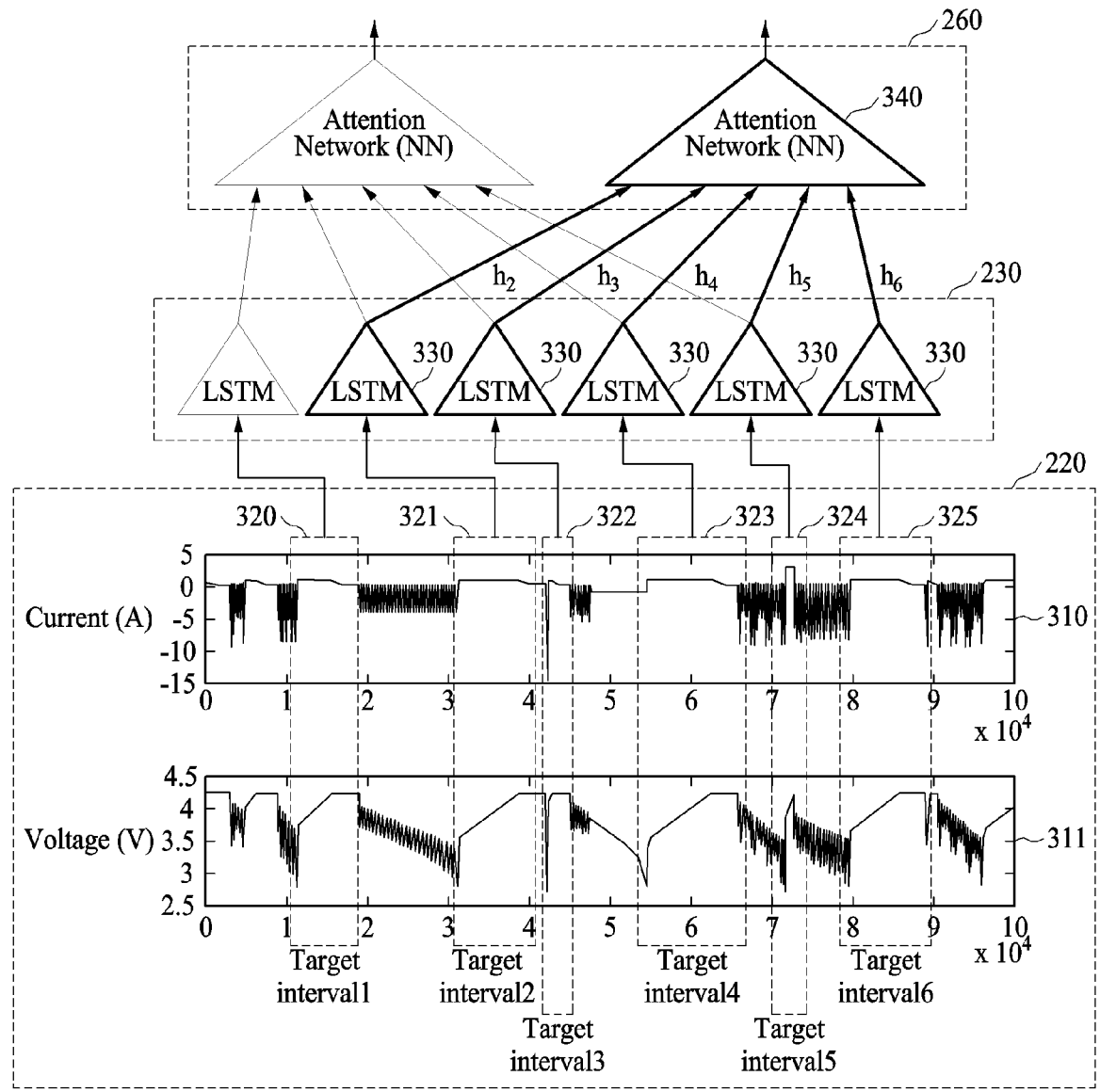

Referring to FIG. 4, when an update event occurs, the extractor 220 additionally sets a target interval 6, for example, a target interval 325 in the current data 310 and the voltage data 311. In an example, the update event occurs in response to a user request or occurs when a current time reaches an update period. In an example, the extractor 220 extracts current data and voltage data in the target interval 325 and outputs the extracted current data and the voltage data to the encoder 230.

The encoder 230 generates a feature vector $h_6$ by encoding the extracted current data and voltage data.

Figure 5:
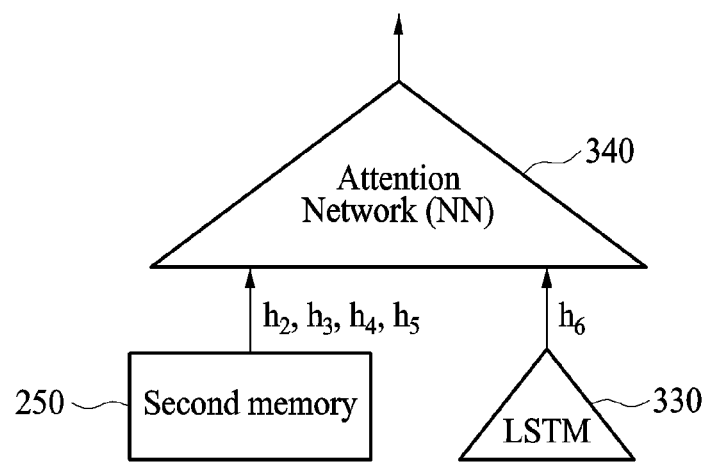

The vector merger 260 receives the feature vector $h_6$ from the encoder 230, and receives the feature vectors $h_2$, $h_3$, $h_4$, and $h_5$ from the second memory 250. Referring to FIG. 5, the vector merger 260 loads the feature vectors $h_2$, $h_3$, $h_4$, and $h_5$ from the second memory 250 and receives the feature vector $h_6$ from the encoder 230.

The vector merger 260 calculates weights based on the feature vectors $h_2$, $h_3$, $h_4$, $h_5$, and $h_6$ and the state information determined above. When weights $\beta_2$, $\beta_3$, $\beta_4$, $\beta_5$, and $\beta_6$ are calculated, the vector merger 260 applies the weights $\beta_2$, $\beta_3$, $\beta_4$, $\beta_5$, and $\beta_6$ to the feature vectors $h_2$, $h_3$, $h_4$, $h_5$, and $h_6$, respectively.

In an example, the vector merger 260 merges feature vectors $\beta_2 h_2$, $\beta_3 h_3$, $\beta_4 h_4$, $\beta_5 h_5$, and $\beta_6 h_6$ to which the weights $\beta_2$, $\beta_3$, $\beta_4$, $\beta_6$, and $\beta_6$ are applied and outputs a result of the merging to the estimator 270.

The estimator 270 updates the state information of the battery 120 based on the merging result of the feature vectors $\beta_2 h_2$, $\beta_3 h_3$, $\beta_4 h_4$, $\beta_5 h_5$, and $\beta_6 h_6$.

The estimator 270 stores the updated state information in the output buffer 280 and removes the feature vector $h_2$ of data corresponding to the oldest target interval, the target interval 321 among the target intervals 321 through 325 from the second memory 250.

Each time that the update event occurs, the operations of the extractor 220, the encoder 230, the vector merger 260, and the estimator 270 described with reference to FIG. 4 may be performed repetitively.

Since the description of FIGS. 1 through 3 is applicable here, repeated description of FIG. 4 will be omitted.

Figure 6:
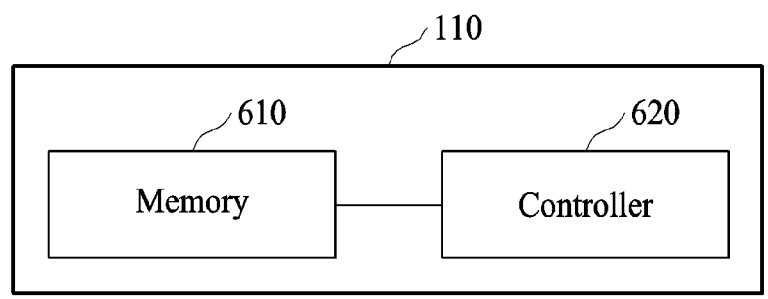
FIG. 6 illustrates an example of a battery state estimation apparatus.

FIG. 6 illustrates an example of a battery state estimation apparatus.

Referring to FIG. 6, the battery state estimation apparatus 110 includes a memory 610 and a controller 620.

The memory 610 stores at least one parameter of a state estimation model. The memory 610 includes a computer-readable storage medium or a computer-readable storage device. The memory 610 includes, for example, random access memories (RAM), dynamic random access memories (DRAM), static random access memories (SRAM), or other types of non-volatile memory known in the art. Further description of the memory is provided below. Also, the memory 610 stores instructions executed by the controller 620.

The controller 620 sets target intervals in sensing data of the battery 120 and extracts data from each of the set target intervals.

The controller 620 determines state information of the battery 120 based on the extracted data and a state estimation model. The controller 620 applies a parameter stored in the memory 610 to the state estimation model.

In an example, the state estimation model includes a first layer through a third layer. In an example, the first layer generates feature vectors of the extracted data. The first layer is trained to perform input pattern change recognition or pattern recognition and thus, recognizes a pattern change of each piece of the extracted data. The first layer generates a feature vector associated with the pattern change of each piece of the extracted data. The first layer corresponds to a neural network, for example, an LSTM. The first layer may correspond to the encoder 230 and the description of encoder 230 are incorporated herein by reference. Thus, the above description may not be repeated here.

The second layer applies weights to feature vectors and merges the feature vectors to which the weights are applied. The second layer corresponds to a neural network, for example, an attention network. The second layer may correspond to the vector merger 260 and the description of vector merger 260 are incorporated herein by reference. Thus, the above description may not be repeated here.

The third layer determines the state information of the battery 120 based on a result of the merging. The third layer may correspond to the estimator 270 and the description of estimator 270 are incorporated herein by reference. Thus, the above description may not be repeated here.

The state estimation model is a model having been trained by a training apparatus. An example of the training will be described with reference to FIG. 10.

Figure 7:
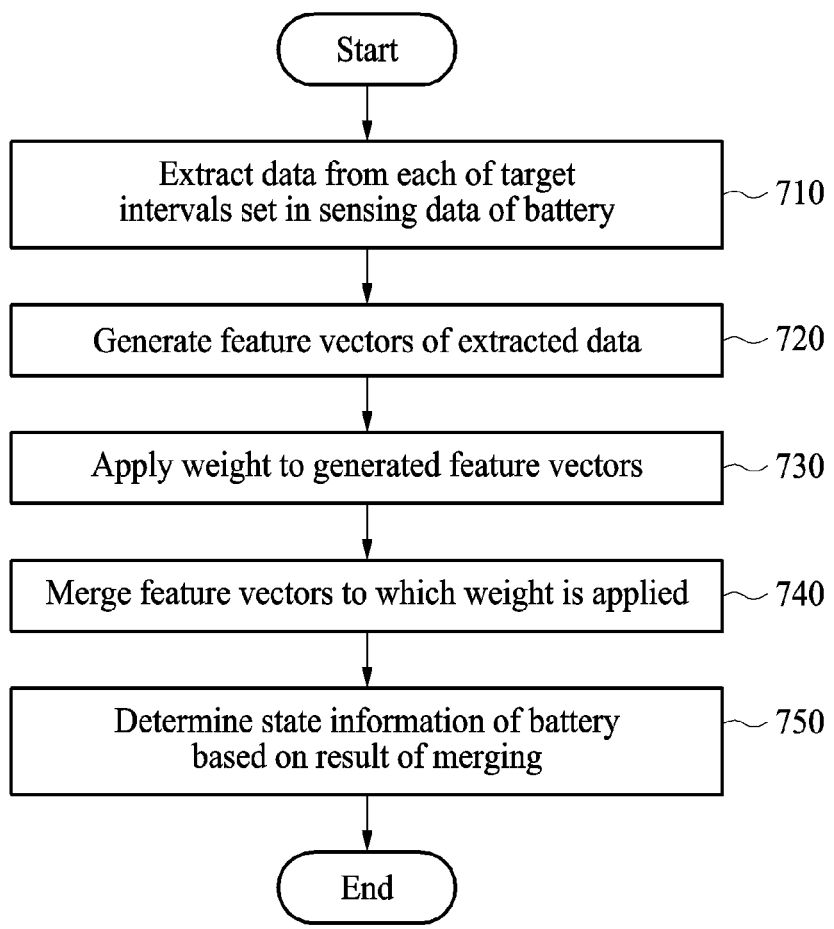
FIG. 7 illustrates an example of a battery state estimation method.

Since the description of FIGS. 1 through 5 is applicable here, in addition to the description of FIG. 6 above, the descriptions of FIGS. 1-5 are incorporated herein by reference. Thus, the above description may not be repeated here FIG. 7 illustrates an example of a battery state estimation method. The operations in FIG. 7 may be performed in the sequence and manner as shown, although the order of some operations may be changed or some of the operations omitted without departing from the spirit and scope of the illustrative examples described. Many of the operations shown in FIG. 7 may be performed in parallel or concurrently. One or more blocks of FIG. 7, and combinations of the blocks, can be implemented by special purpose hardware-based computer that perform the specified functions, or combinations of special purpose hardware and computer instructions. In addition to the description of FIG. 7 below, the descriptions of FIGS. 1-6 are also applicable to FIG. 7, and are incorporated herein by reference. Thus, the above description may not be repeated here.

The battery state estimation method is performed by the battery state estimation apparatus 110.

Referring to FIG. 7, in operation 710, the battery state estimation apparatus 110 extracts data from each of target intervals set for sensing data of the battery 120.

In operation 720, the battery state estimation apparatus 110 generates feature vectors of the extracted data.

In operation 730, the battery state estimation apparatus 110 applies weights to the feature vectors.

In operation 740, the battery state estimation apparatus 110 merges the feature vectors to which the weights are applied.

In operation 750, the battery state estimation apparatus 110 determines state information of the battery 120 based on a result of the merging.

Figure 8A:
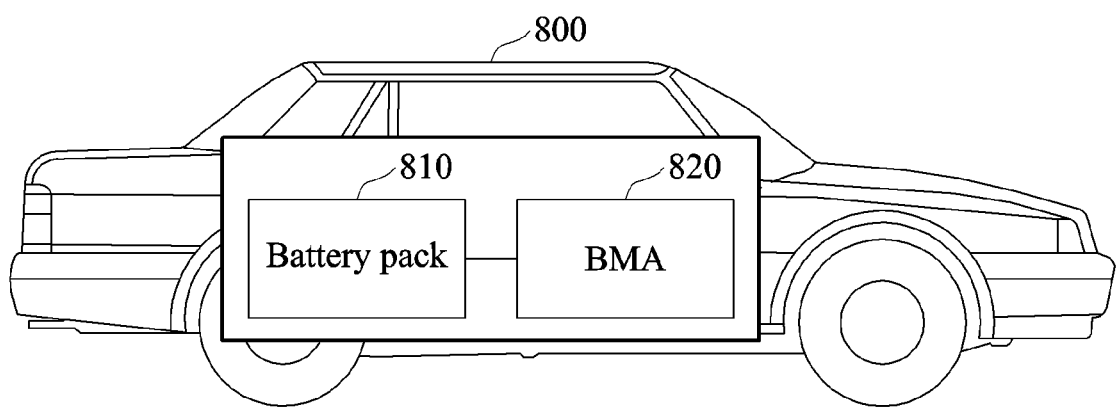
FIGS. 8A and 8B illustrate an example of a vehicle.
Figure 8B:
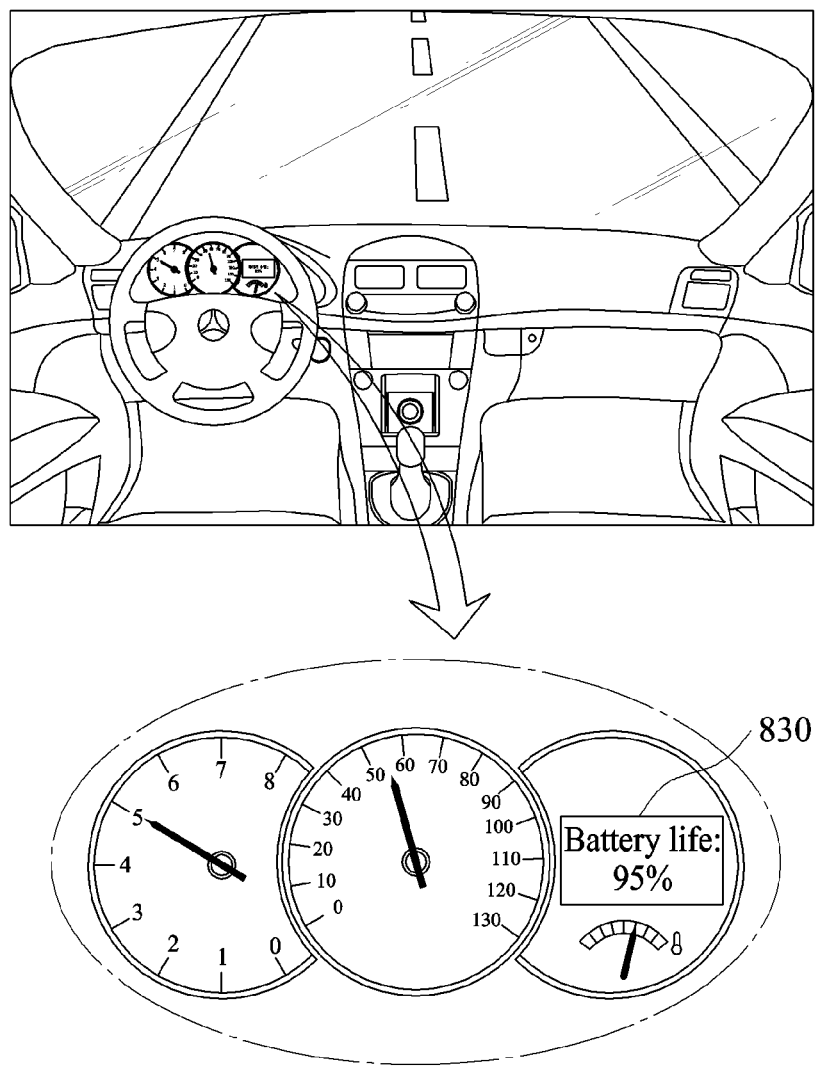

FIGS. 8A and 8B illustrate examples of a vehicle.

Referring to FIG. 8, a vehicle 800 includes a battery pack 810 and a battery management apparatus (BMA) 820. The vehicle 800 uses the battery pack 810 as a power source. The vehicle 800 refers to any mode of transportation, delivery, or communication such as, for example, an automobile, a truck, a tractor, a scooter, a motorcycle, a cycle, an amphibious vehicle, a snowmobile, a boat, a public transit vehicle, a bus, a monorail, a train, a tram, an unmanned aerial vehicle, a drone, an autonomous vehicle, an electric vehicle, or a hybrid vehicle.

The battery pack 810 includes at least one battery module. The battery module includes at least one battery cell.

The battery management apparatus 820 monitors whether an abnormality occurs in the battery pack 810 and prevent the battery pack 810 from being overcharged or over-discharged. The battery management apparatus 820 performs a thermal control on the battery pack 810 when a temperature of the battery pack 810 is higher than a first temperature, for example, 40° C. or lower than a second temperature, for example, −10° C. The battery management apparatus 820 performs a cell balancing such that states of charge of battery cells in the battery pack 810 are equalized.

The battery management apparatus 820 includes the battery state estimation apparatus 110. The battery management apparatus 820 determines state information of the battery pack 810 or state information of a battery cell included in the battery pack 810 using the battery state estimation apparatus 110. The battery management apparatus 820 determines the state information of the battery pack 810 or the state information of the battery cell included in the battery pack 810 when the vehicle 800 is travelling or the battery pack 810 is partially charged and discharged.

The battery management apparatus 820 transmits the determined state information to an electronic control unit (ECU) or a vehicle electronic control unit (VCU) of the vehicle 800. The ECU or the VCU of the vehicle 800 displays the determined state information on a display. As illustrated in FIG. 8B, the ECU or the VCU displays state information 830 of the battery pack 810 on a dashboard of the vehicle 800. Although not shown in FIG. 8B, the ECU or the VCU may display the state information of the battery pack 810 on a head-up display (HUD) of the vehicle 800.

In an example, the ECU or the VCU transmits the state information determined by the battery state estimation apparatus 110 to a terminal of a user through a wireless communication interface of the vehicle 800. In an example, the terminal comprises various types of products such as, for example, an intelligent agent, a mobile phone, a cellular phone, a smart phone, a wearable smart device (such as, a ring, a watch, a pair of glasses, glasses-type device, a bracelet, an ankle bracket, a belt, a necklace, an earring, a headband, a helmet, a device embedded in the cloths, or an eye glass display (EGD)), a server, a personal computer (PC), a laptop, a notebook, a subnotebook, a netbook, an ultra-mobile PC (UMPC), a tablet personal computer (tablet), a phablet, a mobile internet device (MID), a personal digital assistant (PDA), an enterprise digital assistant (EDA), a digital camera, a digital video camera, a portable game console, an MP3 player, a portable/personal multimedia player (PMP), a handheld e-book, an ultra mobile personal computer (UMPC), a portable lab-top PC, a global positioning system (GPS) navigation, a personal navigation device, portable navigation device (PND), a handheld game console, an e-book, communication systems, image processing systems, graphics processing systems, various Internet of Things (IoT) devices that are controlled through a network, other consumer electronics/information technology (CE/IT) device, or any other device capable of wireless communication or network communication consistent with that disclosed herein.

Using the terminal, the user verifies the state information of the battery pack 810 or the state information of the battery cell included in the battery pack 810 at an external area of the vehicle 800.

In addition to the description of FIGS. 8A and 8B above, the descriptions of FIGS. 1-7 are also applicable to FIGS. 8A and 8B, and are incorporated herein by reference. Thus, the above description may not be repeated here.

Figure 9:
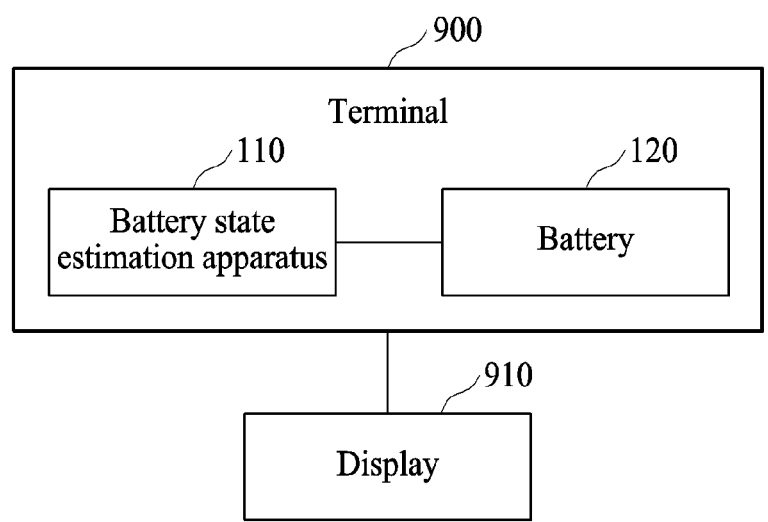
FIG. 9 illustrates an example of a terminal.

FIG. 9 illustrates an example of a terminal.

Referring to FIG. 9, a terminal 900 includes the battery state estimation apparatus 110 and the battery 120. In an example, the terminal 900 includes various types of products such as, for example, an intelligent agent, a mobile phone, a cellular phone, a smart phone, a wearable smart device (such as, a ring, a watch, a pair of glasses, glasses-type device, a bracelet, an ankle bracket, a belt, a necklace, an earring, a headband, a helmet, a device embedded in the cloths, or an eye glass display (EGD)), a server, a personal computer (PC), a laptop, a notebook, a subnotebook, a netbook, an ultra-mobile PC (UMPC), a tablet personal computer (tablet), a phablet, a mobile internet device (MID), a personal digital assistant (PDA), an enterprise digital assistant (EDA), a digital camera, a digital video camera, a portable game console, an MP3 player, a portable/personal multimedia player (PMP), a handheld e-book, an ultra mobile personal computer (UMPC), a portable lab-top PC, a global positioning system (GPS) navigation, a personal navigation device, portable navigation device (PND), a handheld game console, an e-book, a high definition television (HDTV), a smart appliance, communication systems, image processing systems, graphics processing systems, various Internet of Things (IoT) devices that are controlled through a network, other consumer electronics/information technology (CE/IT) device, or any other device capable of wireless communication or network communication consistent with that disclosed herein.

The battery 120 may be a removable battery or an embedded battery.

The terminal 900 determines state information of the battery 120 using the battery state estimation apparatus 110 and displays the determined state information on a display 910. The terminal 900 estimates a remaining life of the battery 120 using the battery state estimation apparatus 110 and displays the estimated remaining life on the display 910.

In an example, the display 910 is a physical structure that includes one or more hardware components that provide the ability to render a user interface and/or receive user input. The display 910 can encompass any combination of display region, gesture capture region, a touch sensitive display, and/or a configurable area. In an example, the display 910 can be embedded in the terminal 900. In an example, the terminal 900 is an external peripheral device that may be attached to and detached from the terminal 900. The display 910 may be a single-screen or a multi-screen display. A single physical screen can include multiple displays that are managed as separate logical displays permitting different content to be displayed on separate displays although part of the same physical screen. The display 910 may also be implemented as an eye glass display (EGD), which includes one-eyed glass or two-eyed glasses. In an example, the display 910 is a head-up display (HUD) or a vehicular infotainment system. However, the display is not limited to the example described in the forgoing, and any other instrument cluster or display panel in the vehicle may perform the display function.

In an example the terminal 900 outputs the determined state information and the estimated remaining life to a speaker to output sound.

Also, the terminal 900 generates notification information based on the determined state information and displays the notification information on the display. For example, the terminal 900 displays, on the display, a message indicating that the battery 120 needs to be replaced by a new battery because the remaining life of the battery 120 is short.

In addition to the description of FIG. 9 above, the descriptions of FIGS. 1-8B are also applicable to FIG. 9, and are incorporated herein by reference. Thus, the above description may not be repeated here.

The battery state estimation apparatus 110 may also be included in an apparatus using a rechargeable secondary battery as a power source in addition to the vehicle 800 and the terminal 900. The battery state estimation apparatus 110 may be included in, for example, an energy storage system (ESS).

Figure 10:
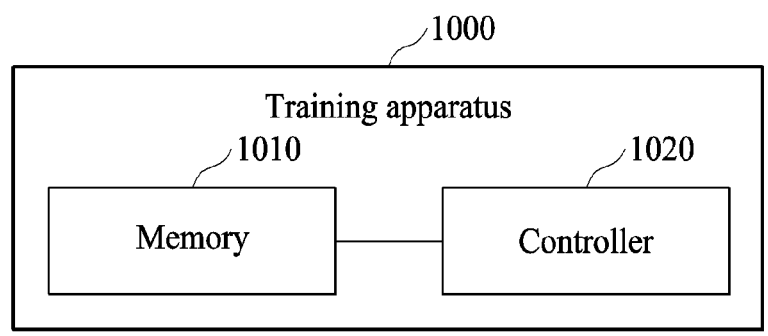
FIG. 10 illustrates an example of a training apparatus.

FIG. 10 illustrates an example of a learning apparatus.

Referring to FIG. 10, a training apparatus 1000 includes a memory 1010 and a controller 1020.

The memory 1010 stores learning data. The learning data is, for example, overall sensing data corresponding to a sensing result obtained while the battery 120 is charged and discharged.

The controller 1020 sets target intervals in the learning data and extracts data included in each of the target intervals. The controller 1020 trains a state estimation model including a first layer through a third layer based on the extracted data. The controller 1020 trains the first layer such that the first layer recognizes a pattern change of each piece of the extracted data. The controller 1020 optimizes at least one parameter of each layer. The optimized parameter is stored in the first memory 240 or the memory 610 of the battery state estimation apparatus 110.

The battery state estimation apparatus 110, input buffer 210, extractor 220, encoder 230, vector merger 260, estimator 270, output buffer 280, attention network 340, battery management apparatus (BMA) 820, and training apparatus 1000, and other apparatuses, units, modules, devices, and other components described herein are implemented by hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software includes at least one of an applet, a dynamic link library (DLL), middleware, firmware, a device driver, an application program storing the method of preventing the collision. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and providing the instructions or software and any associated data, data files, and data structures to a processor or computer so that the processor or computer can execute the instructions.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method of estimating a state of a battery, the method comprising:
   extracting data from target intervals in sensing data of a battery;
   generating feature vectors of the data extracted from each of the target intervals;
   applying first weights to the generated feature vectors;
   merging the feature vectors to which the first weights are applied;
   determining state information of the battery based on the merging, and updating the state information in response to an occurrence of an update event of the state information,
wherein the updating comprises:
   setting an additional target interval in the sensing data and extracting data from the additional target interval;
   generating an additional feature vector indicating a feature vector of the data extracted from the additional target interval; and
   updating the state information based on applying second weights to the generated additional feature vector and a portion of the Generated feature vectors.

2. The method of claim 1, wherein the generating of the feature vectors comprises:
   sampling the extracted data from the each of the target intervals; and
   encoding the sampled data to generate the feature vectors.

3. The method of claim 1, wherein the applying comprises:
   calculating the first weights based on the generated feature vectors and a previous state information of the battery; and
   applying the calculated first weights to the generated feature vectors.

4. The method of claim 1, wherein the generating of the additional feature vector comprising generating the additional feature vector by encoding the data extracted from the additional target interval.

5. The method of claim 1, further comprising:
   randomly setting each of the target intervals in the sensing data.

6. The method of claim 1, wherein lengths of the target intervals are different from one another.

7. The method of claim 1, wherein the update event corresponds to any one of a user input or a time exceeding an update time period.

8. The method of claim 1, wherein a greatest first weight of the first weights is applied to a feature vector associated with a target interval having a most stable pattern change from among the target intervals.

9. A non-transitory computer-readable storage medium storing instructions that, when executed by a processor, cause the processor to perform the method of claim 1.

10. An apparatus for estimating a state of a battery, the apparatus comprising:
   a controller configured to extract data from target intervals in sensing data of a battery, to generate feature vectors of the data extracted from each of the target intervals, to apply first weights to the generated feature vectors, to merge the feature vectors to which the first weights are applied, to determine state information of the battery based on the merged feature vectors, and to update the state information in response to an occurrence of an update event of the state information,
   wherein, for updating the state information, the controller is further configured to set an additional target interval in the sensing data and extracting data from the additional target interval to generate an additional feature vector indicating a feature vector of the data extracted from the additional target interval, and update the state information based on applying second weights to the generated additional feature vector and a portion of the generated feature vectors.

11. The apparatus of claim 10, wherein the controller is further configured to sample the extracted data from the each of the target intervals, to encode the sampled data, and to generate the feature vectors.

12. The apparatus of claim 10, wherein the controller is further configured to calculate the first weights based on the generated feature vectors and a previous state information of the battery, and to apply the first calculated weights to the generated feature vectors.

13. The apparatus of claim 10, wherein the controller is further configured to et generate the additional feature vector by encoding the data extracted from the additional target interval.

14. The apparatus of claim 10, wherein the controller is further configured to randomly set each of the target intervals in the sensing data.

15. The apparatus of claim 10, wherein lengths of the target intervals are different from one another.

16. The apparatus of claim 10, wherein a greatest first weight of the first weights is applied to a feature vector associated with a target interval having a most stable pattern change from among the target intervals.

17. An apparatus for estimating a state of a battery, the apparatus comprising:
   a controller configured to extract data from target intervals in sensing data of a battery, and to determine state information of the battery based on the extracted data and a state estimation model,
   wherein the state estimation model comprises:
   a first layer configured to generate feature vectors of the data extracted from each of the target intervals;
   a second layer configured to apply first weights to the generated feature vectors and to merge the feature vectors to which the first weights are applied; and
   a third layer configured to determine the state information of the battery based on the merged feature vectors, and
   wherein, in response to an occurrence of an update event of the state information:
      the controller is further configured to set an additional target interval in the sensing data and extract data from the additional target interval,
      the first layer is further configured to generate an additional feature vector indicating a feature vector of the data extracted from the additional target interval,
      the second layer is further configured to apply second weights to the generated additional feature vector and a portion of the generated feature vectors, and
      the third layer is further configured to u date the state information based on applying the second weights to the generated additional feature vector and the portion of the generated feature vectors.

18. The apparatus of claim 17, wherein the first layer is further configured to recognize a pattern change of each piece of the extracted data.

19. The apparatus of claim 17, wherein the second layer is further configured to calculate the first weights based on the generated feature vectors and previous state information of the battery.

20. The apparatus of claim 17, wherein the third layer is further configured to determine the state information by performing regression on the merged feature vectors.

21. A vehicle comprising:
   a battery module;
   sensors configured to sense data of the battery module; and
   a battery state estimation apparatus implemented on a processor, the battery state estimation apparatus comprising:

an extractor configured to receive the sensed data, to set target intervals in the sensed data, and to extract data from each of the target intervals, an encoder configured to generate feature vectors corresponding to each target interval based on encoding the extracted data from the each target interval, respectively, a vector merger configured to apply first weights to the generated feature vectors, and to merge the weighted feature vectors, and an estimator configured to determine state information of the battery module based on the merged feature vectors, wherein, in response to an occurrence of an u date event of the state information:

the extractor is further configured to set an additional target interval in the sensing data and extract data from the additional target interval, the encoder is further configured to generate an additional feature vector indicating a feature vector of the data extracted from the additional target interval, the vector merger is further configured to apply second weights to the generated additional feature vector and a portion of the generated feature vectors, and the estimator is further configured to u date the state information based on applying the second weights to the generated additional feature vector and the portion of the generated feature vectors.

22. The vehicle of claim 21, wherein each of the feature vectors corresponds to a change in a pattern of the data extracted from the each target interval, respectively.

23. The vehicle of claim 22, wherein a greatest first weight of the first weights is applied to a feature vector from the feature vectors having the least change in the pattern of the extracted data.

24. The vehicle of claim 21, wherein the data of the battery module comprises any one or any combination of voltage data, current data, and temperature data of the battery module.

25. The vehicle of claim 21, further comprising:

a memory coupled to the processor, the memory comprising an instruction executed by the processor, and the memory being configured to store the sensed data, the feature vectors, and the determined state information; and an output configured to communicate the determine state information of the battery.

* * * * *